United States Patent
Yu et al.

(10) Patent No.: US 12,532,784 B2
(45) Date of Patent: Jan. 20, 2026

(54) INTEGRATED CIRCUIT CHIP AND SEMICONDUCTOR PACKAGE

(71) Applicant: SAMSUNG ELECTRONICS CO., LTD., Suwon-si (KR)

(72) Inventors: Bong Wee Yu, Anyang-si (KR); Eun-Hee Kim, Seoul (KR); Kyoung-Min Lee, Yongin-si (KR)

(73) Assignee: Samsung Electronics Co., Ltd., South (KR)

( * ) Notice: Subject to any disclaimer, the term of this patent is extended or adjusted under 35 U.S.C. 154(b) by 439 days.

(21) Appl. No.: 17/994,161

(22) Filed: Nov. 25, 2022

(65) Prior Publication Data

US 2023/0282624 A1   Sep. 7, 2023

(30) Foreign Application Priority Data

Mar. 7, 2022   (KR) .......................... 10-2022-0028556

(51) Int. Cl.
*H01L 23/02*  (2006.01)
*H01L 23/00*  (2006.01)
(Continued)

(52) U.S. Cl.
CPC .......... *H01L 25/105* (2013.01); *H01L 23/481* (2013.01); *H01L 23/49816* (2013.01);
(Continued)

(58) Field of Classification Search
CPC ................. H01L 25/105; H01L 23/481; H01L 23/49816; H01L 23/49822; H01L 23/49833; H01L 23/49838; H01L 24/16; H01L 24/32; H01L 24/73; H01L 2224/16235; H01L 2224/32225;
(Continued)

(56) References Cited

U.S. PATENT DOCUMENTS 6,239,495 B1   5/2001   Sakui et al.
8,648,615 B2   2/2014   Rahman
(Continued)

FOREIGN PATENT DOCUMENTS

JP   2003-506951 A   2/2003
JP   2004281633 A   10/2004
(Continued)

OTHER PUBLICATIONS

Office Action in Korean Applnl. No. KR 10-2022-0028556, mailed on Oct. 16, 2025, 12 pages (with English translation).

*Primary Examiner* — Theresa T Doan
(74) *Attorney, Agent, or Firm* — Fish & Richardson P.C.

(57) ABSTRACT

An integrated circuit chip includes; a package substrate including a first signal ball, a first semiconductor chip on the package substrate, a second semiconductor chip on the first semiconductor chip, a first bump disposed between the package substrate and the first semiconductor chip and electrically connected to the first signal ball, and a second bump disposed between the first semiconductor chip and the second semiconductor chip and electrically connected to the first signal ball, wherein during a first mode, the first signal ball receives a signal from the first semiconductor chip through the first bump and receives a signal from the second semiconductor chip through the second bump.

20 Claims, 15 Drawing Sheets

(51) Int. Cl.
*H01L 23/48* (2006.01)
*H01L 23/498* (2006.01)
*H01L 25/10* (2006.01)

(52) U.S. Cl.
CPC .. *H01L 23/49822* (2013.01); *H01L 23/49833* (2013.01); *H01L 23/49838* (2013.01); *H01L 24/16* (2013.01); *H01L 24/32* (2013.01); *H01L 24/73* (2013.01); *H01L 2224/16235* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2924/1431* (2013.01); *H01L 2924/1434* (2013.01); *H01L 2924/182* (2013.01); *H01L 2924/3011* (2013.01)

(58) Field of Classification Search
CPC ... H01L 2224/73204; H01L 2225/1023; H01L 2225/1041; H01L 2225/1058; H01L 2924/1431; H01L 2924/1434; H01L 2924/182; H01L 2924/3011; H01L 23/50; H01L 2225/107; H01L 25/18; H01L 21/4853; H01L 21/561; H01L 23/3128; H01L 25/0657; H01L 24/17; H01L 2225/06513; H01L 2225/06517; H01L 2225/06541; G11C 5/04
USPC ........................................................ 257/686
See application file for complete search history.

(56) References Cited

U.S. PATENT DOCUMENTS

| | | |
|---|---|---|
| 8,896,089 B2 | 11/2014 | Chin et al. |
| 9,230,619 B2 | 1/2016 | Ishikawa |
| 11,073,550 B1 | 7/2021 | Gong et al. |
| 2010/0148354 A1* | 6/2010 | Choi ................... H01L 23/5385 |
| | | 257/E21.52 |
| 2013/0141442 A1* | 6/2013 | Brothers ................... G06T 1/20 |
| | | 345/502 |
| 2013/0313681 A1* | 11/2013 | Goekcen ........... H01L 23/49589 |
| | | 257/534 |

FOREIGN PATENT DOCUMENTS

| | | |
|---|---|---|
| JP | 2004317352 A | 11/2004 |
| KR | 10-2019-0089282 A | 7/2019 |

* cited by examiner

FIG. 8

|  | Output mode | Non-output mode | | |
| --- | --- | --- | --- | --- |
|  |  | Input mode | Fail-safe mode | Power off mode |
| Mode 1 | semiconductor chip 1 (200) | semiconductor chip 2 (500) | | |
| Mode 2 | semiconductor chip 2 (500) | semiconductor chip 1 (200) | | |

INTEGRATED CIRCUIT CHIP AND SEMICONDUCTOR PACKAGE

CROSS-REFERENCE TO RELATED APPLICATION

This U.S. nonprovisional application claims priority under 35 U.S.C. § 119 from Korean Patent Application No. 10-2022-0028556 filed on Mar. 7, 2022 in the Korean Intellectual Property Office, the subject matter of which is hereby incorporated by reference in its entirety.

BACKGROUND

1. Technical Field

The inventive concept relates generally to integrated circuit chips and semiconductor packages.

2. Description of the Related Art

Continuing developments in the electronics industry demand constituent elements components and systems characterized by decreased physical size, yet improved performance and increased operating speed. In response to these demands, various techniques for mounting (e.g., mechanically assembling and/or electrically connecting) elements, components and system techniques within a semiconductor device have been proposed. For example, a plurality of semiconductor chips may be mounted on one package substrate. Alternately, one package may be stacked on another package. In this regard, so-called package-in-package (PIP) type semiconductor packages, and package-on-package (POP) type semiconductor packages have been used.

Where a plurality of semiconductor chips is mounted within a single package, one or more signal ball(s) used to input and/or output various electrical signals are usually required. However, due to increasing demands for reduced semiconductor package size, only a limited amount of space is available for the disposition and arrangement of signal ball(s).

SUMMARY

Embodiments of the inventive concept provide integrated circuit chips and semiconductor packages exhibiting reduced physical size, without adversely affecting overall operation of elements, components and/or systems within the semiconductor package.

In some embodiments, the inventive concept provides an integrated circuit chip including; an integrated circuit chip including; a package substrate including a first signal ball, a first semiconductor chip on the package substrate, a second semiconductor chip on the first semiconductor chip, a first bump disposed between the package substrate and the first semiconductor chip and electrically connected to the first signal ball, and a second bump disposed between the first semiconductor chip and the second semiconductor chip and electrically connected to the first signal ball, wherein during a first mode, the first signal ball receives a signal from the first semiconductor chip through the first bump and receives a signal from the second semiconductor chip through the second bump.

In some embodiments, the inventive concept provides a semiconductor package including; a connection terminal including a first signal ball, a package substrate on the connection terminal, a first semiconductor chip on the package substrate, connected to the package substrate through a flip-chip structure, configured to output a first output signal through the first signal ball during a first mode, and further configured to not output the first output signal through the first signal ball during a second mode, and a second semiconductor chip on the first semiconductor chip, connected to the first semiconductor chip through a flip-chip structure, configured to output a second output signal through the first signal ball during the second mode, and further configured to not output the second output signal through the first signal ball during the first mode, wherein during the first mode, the first semiconductor chip is in an output mode and the second semiconductor chip is in a non-output mode, during the second mode, the second semiconductor chip is in the output mode and the first semiconductor chip is in the non-output mode, the first semiconductor chip is a memory device, and the second semiconductor chip is an application processor that controls operation of the memory device.

In some embodiments, the inventive concept provides a semiconductor package including; a connection terminal including a first signal ball and a second signal ball, a package substrate on the connection terminal and electrically connected to the connection terminal, a first semiconductor package on the package substrate and including a first semiconductor chip configured to output a first output signal to the first signal ball through a first bump connected to the package substrate and output a third output signal to the second signal ball through a third bump, and a second semiconductor package on the package substrate and including a second semiconductor chip configured to output a second output signal to the first signal ball through a second bump connected to the package substrate and output a fourth output signal to the second signal ball through a fourth bump, wherein the first semiconductor package and the second semiconductor package are vertically stacked on the package substrate, the first signal ball is configured to output one of the first output signal provided from the first bump and the second output signal provided from the second bump, when the first signal ball outputs the first output signal, the first semiconductor chip operates in an output mode and the second semiconductor chip operates in one of an input mode, a fail-safe mode, and a power-off mode, the second bump is electrically connected to the first signal ball through a through-via disposed within the first semiconductor chip, and the fourth bump is electrically connected to the second signal ball through a connection member disposed around the first semiconductor chip.

BRIEF DESCRIPTION OF THE DRAWINGS

Advantages, benefits and features, as well as the making and use of the inventive concept will become more apparent upon consideration of the following detailed description together with the accompanying drawings, in which:

FIG. 8 is a table listing exemplary explaining modes of operation for the first semiconductor chip and second semiconductor chip;

DETAILED DESCRIPTION

Throughout the written description and drawings, like reference numbers and labels are used to denote like or similar elements, components, features and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
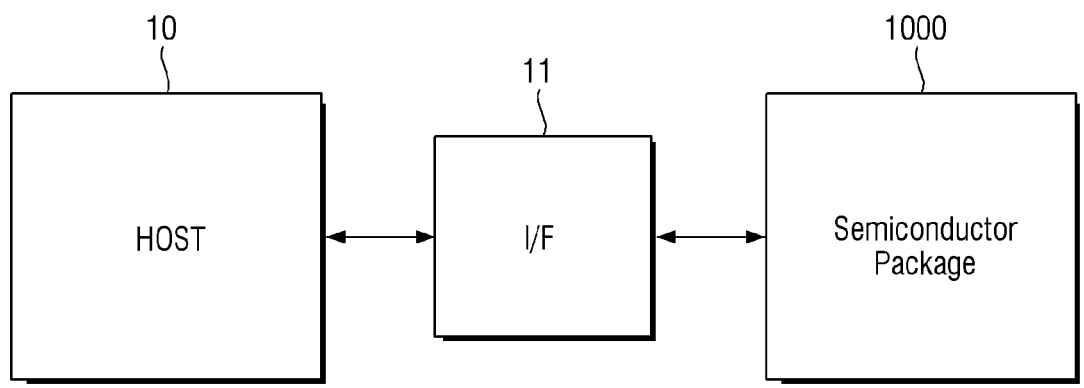
FIG. 1 is a general block diagram illustrating an electronic device according to embodiments of the inventive concept.
Figure 2:
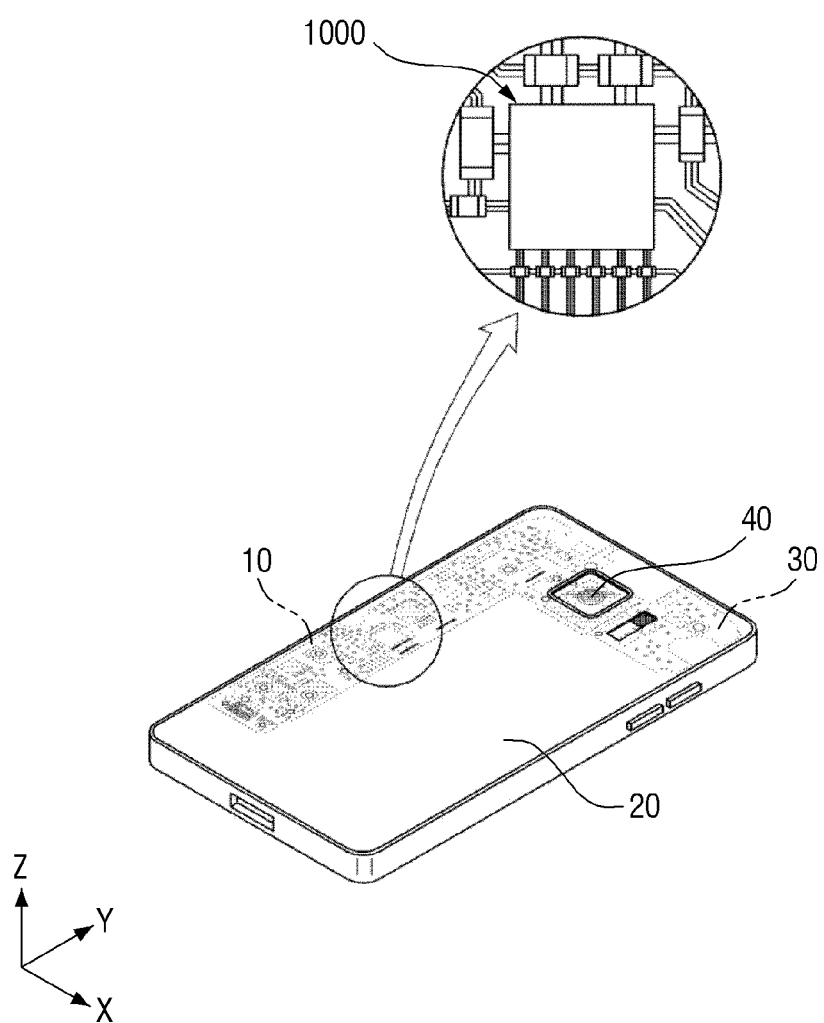
FIG. 2 is a perspective diagram with cut-away further illustrating in one example the electronic device of FIG. 1.
Figure 3:
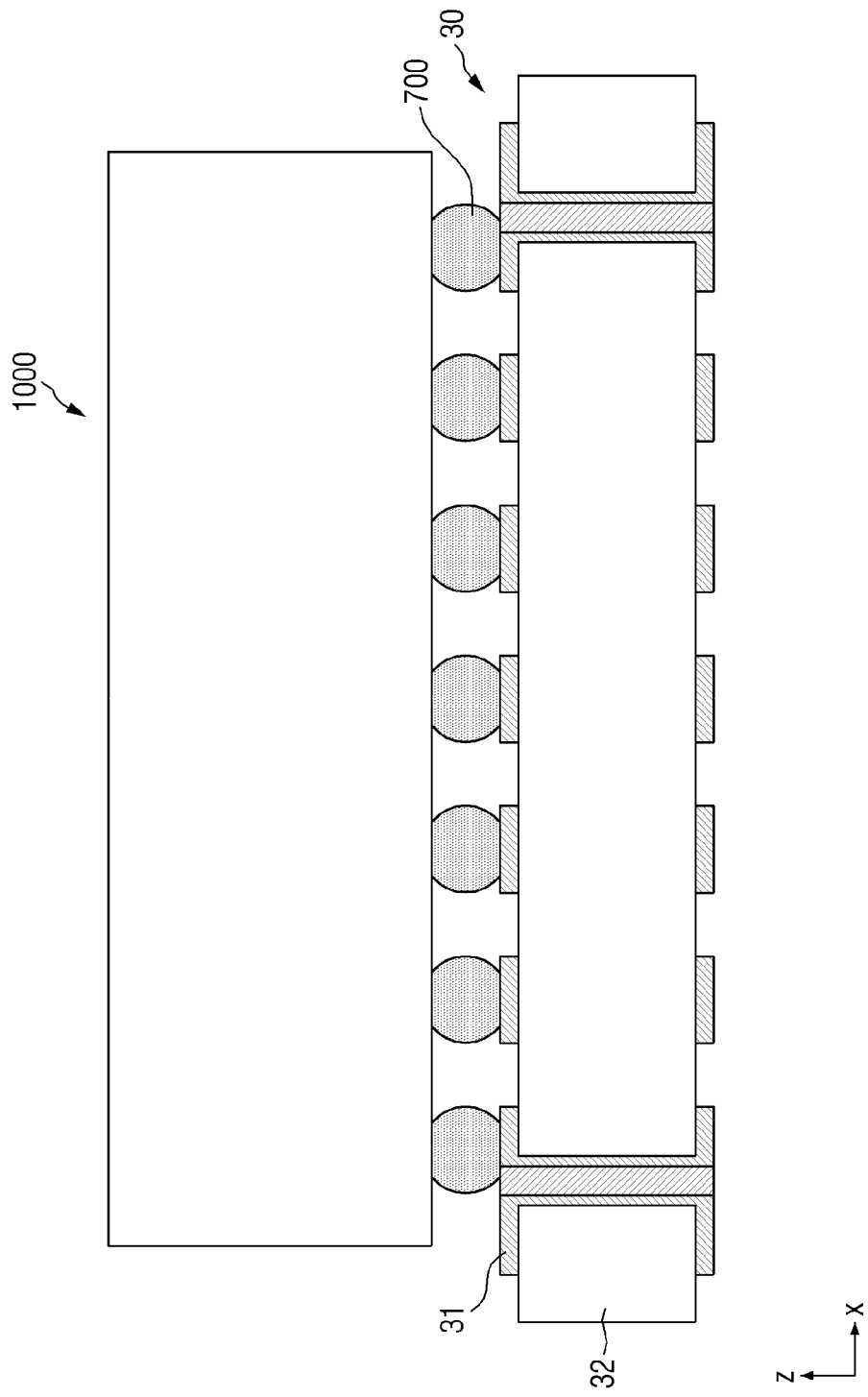
FIG. 3 is a cross-sectional diagram further illustrating in one example the main board of FIG. 2.
Figure 4:
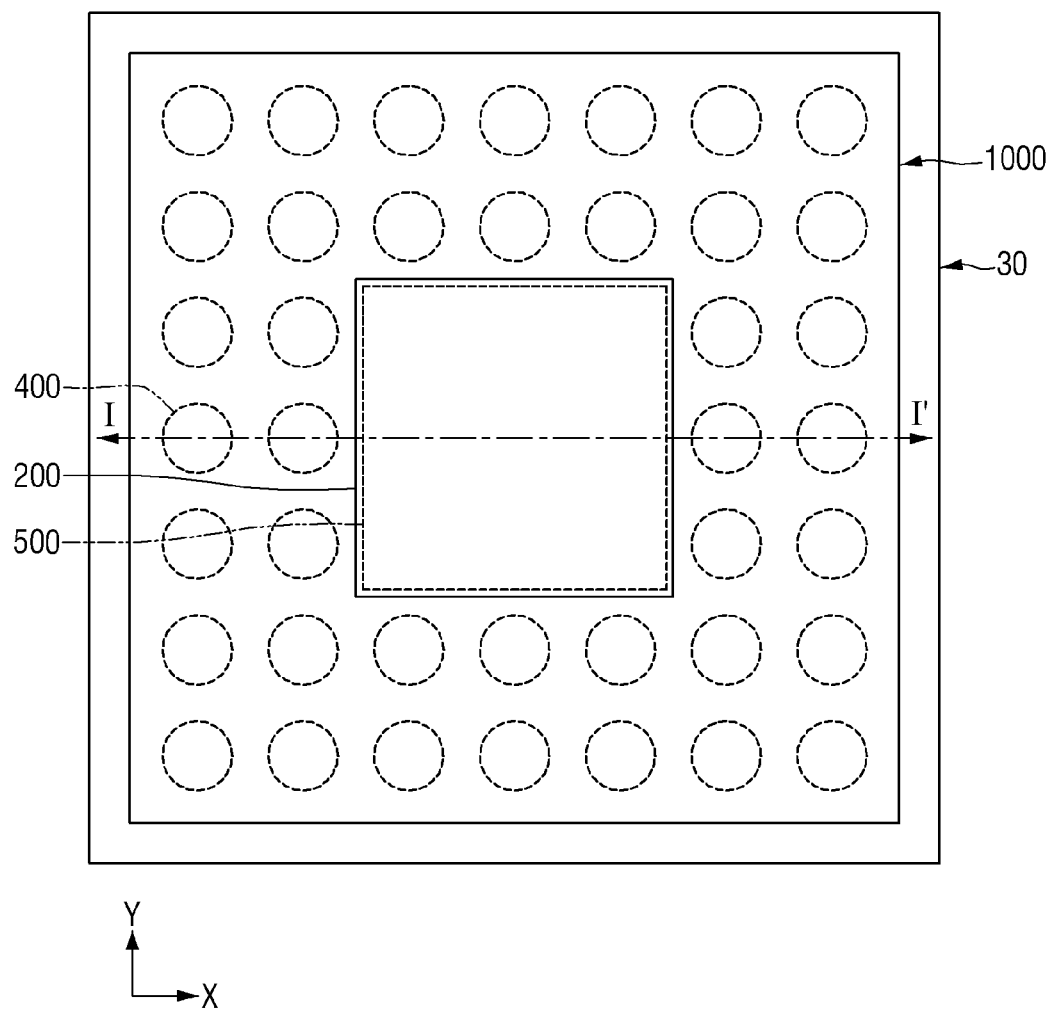
FIG. 4 is a plan (or top-down) diagram further illustrating the semiconductor package of FIG. 3 according to embodiments of the inventive concept.
Figure 5:
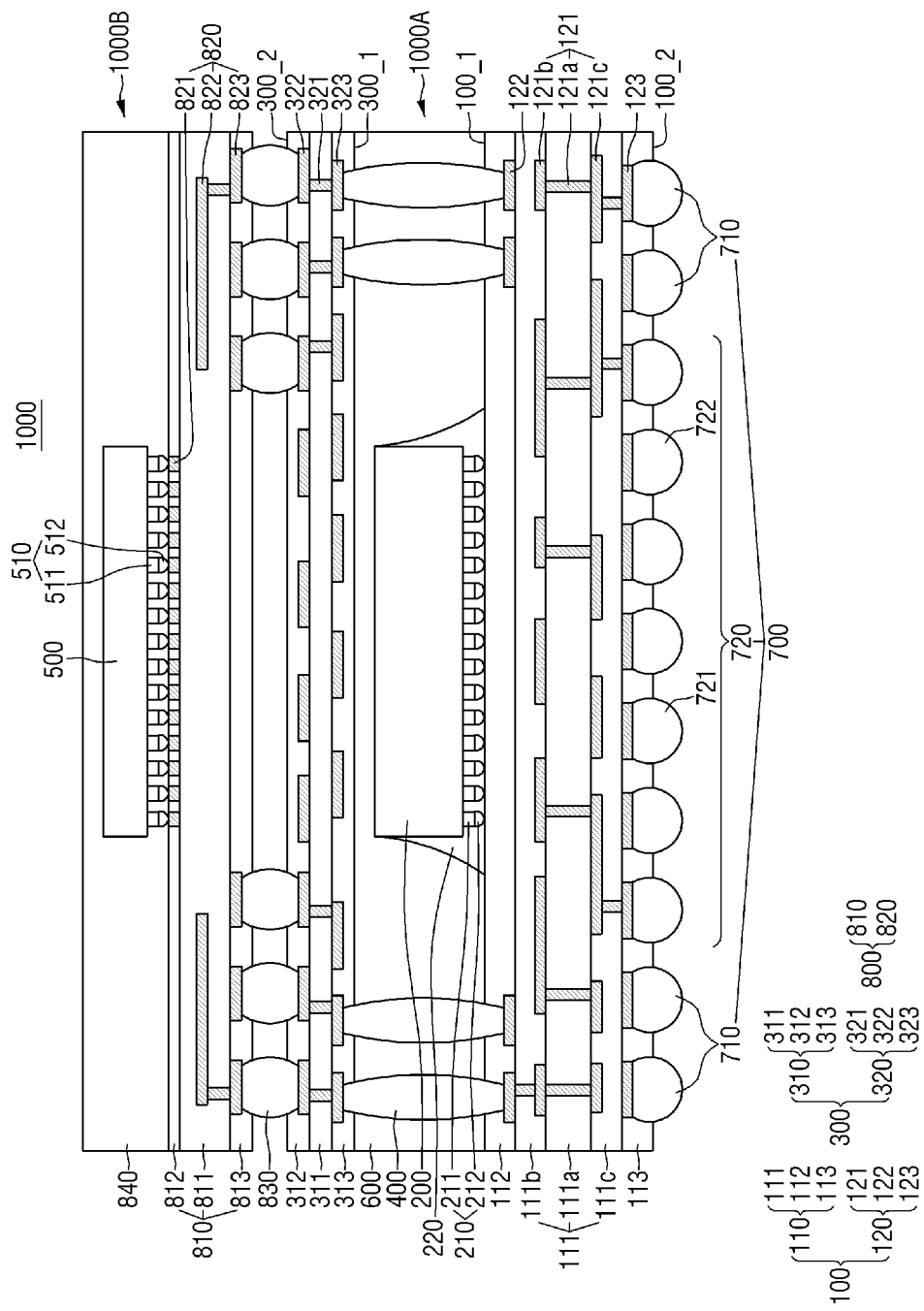
FIG. 5 is a cross-sectional diagram taken along line I-I' of FIG. 4 and further illustrating the semiconductor package of FIG. 3.

FIG. 1 is a general block diagram illustrating an electronic device according to embodiments of the inventive concept, FIG. 2 is a perspective diagram with cut-away further illustrating in one example the electronic device of FIG. 1, and FIG. 3 is a cross-sectional diagram further illustrating in one example the main board of FIG. 2. Here, FIG. 4 is a plan (or top-down) diagram further illustrating the semiconductor package of FIG. 3 and FIG. 5 is a cross-sectional diagram taken along line I-I' of FIG. 4 and further illustrating the semiconductor package of FIG. 3.

Referring to FIG. 1, an electronic device 1 may include a host 10, an interface 11, and a semiconductor package 1000, wherein the semiconductor package 1000 may be referred to hereafter as an integrated circuit chip 1000.

Here, the host 10 may be connected to the semiconductor package 1000 through the interface 11. For example, the host 10 may communicate (e.g., transmit and/or receive) a signal to the semiconductor package 1000 that controls the operation of the semiconductor package 1000, and the semiconductor package 1000 may communicate a signal to the host 10 following operation (e.g., a data access operation, such as a read operation, a write (or program) operation, etc.) of the semiconductor package 1000.

In some embodiments, the host 10 may include at least one of a central processing unit (CPU), a controller, a processor, an application specific integrated circuit (ASIC), and a memory chip (e.g., a dynamic random access memory (DRAM), a static RAM (SRAM), a phase-change RAM (PRAM), a magneto resistive RAM (MRAM), a ferroelectric RAM (FeRAM), a resistive RAM (RRAM), etc.).

Referring to FIG. 2, the electronic device 1 may include the host 10, a body 20, a main board 30, a camera module 40, and the semiconductor package 1000, among other components.

Here, the main board 30 may be mounted on the body 20 of the electronic device 1. The host 10, the camera module 40, and the semiconductor package 1000 may be mounted on the main board 30. The host 10, the camera module 40, and the semiconductor package 1000 may be electrically connected by the main board 30. In some embodiments, the interface 11 may be implemented within the main board 30. Accordingly, the host 10 and the semiconductor package 1000 may be electrically connected, wholly or in part, through the main board 30 in order to communicate various electrical signals.

Referring to FIG. 3, the semiconductor package 1000 may be disposed on the main board 30. For example, a first connection terminal 700 may be disposed on the main board 30. The main board 30 may be connected to the semiconductor package 1000 by the first connection terminal 700.

The main board 30 may be a printed circuit board (PCB), a ceramic wiring structure, a glass wiring structure, an interposer wiring structure, etc. Hereafter, it is assumed for purposes of descriptive clarity that the main board 30 is a PCB.

The main board 30 may include a connection structure 31 and a core 32, wherein the core 32 may include a copper clad laminate (CCL), a prepreg (PPG), an Ajimoto build-up film (ABF), epoxy, polyimide, etc. The connection structure 31 may include, for example, at least one of copper (Cu), aluminum (Al), silver (Ag), tin (Sn), gold (Au), nickel (Ni), lead (Pb), and titanium (Ti).

The core 32 may be disposed in a central part of the main board 30, and the connection structure 31 may be disposed on upper and/or lower parts of the core 32. That is, portions of the connection structure 31 may be exposed on the upper and/or lower parts of the main board 30.

Alternately or additionally, the connection structure 31 may penetrate the core 32, such that the connection structure 31 may electrically connect various elements, components and/or systems associated with the main board 30. As one example, the connection structure 31 may be used to electrically connect the semiconductor package 1000 and the host 10. For example, the connection structure 31 may electrically connect the semiconductor package 1000 and the host 10 through first connection terminals 700.

Referring to FIG. 5, the semiconductor package 1000 may include a first semiconductor package 1000A including a first wiring structure 100, a first semiconductor chip 200, an interposer 300, a connection member 400, and a first mold layer 600. In addition, the semiconductor package 1000 may include a second semiconductor package 1000B including a second semiconductor chip 500. In some embodiments, the first semiconductor package 1000A and the second semiconductor package 1000B may be vertically stacked (e.g., in a vertical direction-Z) in relation to a principal surface of the semiconductor package 1000 (e.g., extending in horizontal directions X and Y).

The first wiring structure 100 may be a wiring structure associated with packaging. For example, the first wiring structure 100 may be a PCB, a ceramic wiring structure, etc. Alternately, the first wiring structure 100 may be a wiring structure associated with a wafer-level package. The first wiring structure 100 may include a first surface 100_1 and an opposing second surface 100_2.

The first wiring structure 100 may include a first insulating layer 100 and a first wiring pad 120. The first insulating layer 110 may include a first substrate 111, a first upper passivation layer 112, and a first lower passivation layer 113. The first wiring pad 120 may include a first wiring pattern 121, first upper pads 122, and first lower pads 123.

The first substrate 111 may be, for example, a PCB or a ceramic substrate. However, the inventive concept is not limited thereto.

Assuming that the first substrate 111 is a PCB, the first insulating layer 110 may include at least one material selected from phenol resin, epoxy resin, and polyimide. The first substrate 111 may include, for example, at least one material selected from tetrafunctional epoxy, polyphenylene ether, epoxy/polyphenylene oxide, bismaleimide triazine (BT), thermount, cyanate ester, and liquid crystal polymer.

The first substrate 111 may include resin and at least one inorganic filler in a core material such as, for example a glass fiber (or glass cloth or a glass fabric), prepreg, ABF, FR-4, BT, etc.

Assuming that the first substrate 11 includes resin and an inorganic filler in a core material, the first substrate 111 may further include a core insulating layer 111a and upper and lower insulating layers 111b and 111c that are respectively disposed in upper and lower portions of the core insulating layer 111a. When a material having high rigidity such as the prepreg containing a glass fiber or similar is used, warpage may be more effectively controlled.

Surfaces of the first substrate 111 may be covered, wholly or in part, with a solder resist. That is, the first upper passivation layer 112 and the first lower passivation layer 113 formed on surfaces of the first substrate 111 may each be a solder resist. The first upper passivation layer 112 and the first lower passivation layer 113 may include, for example, a photoimageable dielectric (PDI) material. However, the inventive concept is not limited thereto.

The first wiring pad 120 may be disposed within the first insulating layer 110. The first wiring pad 120 may be configured as the first wiring pattern 121 for electrically connecting the first lower pads 123 and the first upper pads 122. The first wiring pattern 121 may include a plurality of upper and lower wiring patterns 121b and 121c and at least one wiring via 121a connecting the upper and lower wiring patterns 121b and 121c.

Although the first insulating layer 110 is shown as having five layers, this is merely one example and the inventive concept is not limited thereto. For example, the first insulating layer 110 may include more than five layers, such that a multi-layered first wiring pad 120 may be formed.

In some embodiments, first connection terminals 700 may be formed on the second surface 100_2 of the first wiring structure 100. The first connection terminals 700 may be attached to the first lower pads 123.

The first connection terminals 700 may have, for example, a spherical shape or an elliptical spherical shape, but the inventive concept is not limited thereto. The first connection terminals 700 may include at least one of, for example, tin (Sn), indium (In), lead (Pb), zinc (Zn), nickel (Ni), gold (Au), silver (Ag), copper (Cu), antimony (Sb), and bismuth (Bi), but the inventive concept is not limited thereto.

The first connection terminals 700 may electrically connect the first wiring structure 100 to an external device. Accordingly, the first connection terminals 700 may provide an electrical signal to the first wiring structure 100 or may provide an electrical signal provided from the first wiring structure 100 to the external device.

The first upper passivation layer 112 and the first upper pad 122 may be formed on the upper surface of the first substrate 111. The first upper pads 122 may be disposed between the first upper passivation layer 112 and the first substrate 111. In some embodiments, the first upper passivation layer 112 may be selectively formed on the first substrate 111 to expose the first upper pads 122.

The first lower passivation layer 113 and the first lower pads 123 may be formed on the lower surface of the first substrate 111. The first lower pads 123 may be disposed between the first lower passivation layer 113 and the first substrate 111. In some embodiment, the first lower passivation layer 113 may be selectively formed on the first substrate 111 to expose the first lower pads 123.

The first semiconductor chip 200 may be disposed on the first wiring structure 100. For example, the first semiconductor chip 200 may be mounted on the first surface 100_1 of the first wiring structure 100. The first semiconductor chip 200 may include an integrated circuit (IC) chip having a vast number of constituent semiconductor elements. For example, the first semiconductor chip 200 may be an application processor (AP), such as a central processing unit (CPU), a graphics processing unit (GPU), a field programmable gate array (FPGA), a digital signal processor, a cryptographic processor, a microprocessor, and a microcontroller, but the inventive concept is not limited thereto. Here, the first semiconductor chip 200 may be a logic chip, such as an analog-to-digital converter (ADC) or an application-specific integrated circuit (ASIC), or a memory chip, such as a volatile memory (e.g., a DRAM) or a nonvolatile memory (e.g., a read-only memory (ROM) or flash memory). Further, the first semiconductor chip 200 may be configured as a combination thereof. Hereinafter, the first semiconductor chip 200 will be described as a memory chip including a volatile memory and/or a nonvolatile memory.

Although only a single first semiconductor chip 200 is shown as being formed on the first wiring structure 100, this is merely a convenient example and the inventive concept is not limited thereto. For example, a plurality of first semiconductor chips 200 may be formed in parallel on the first wiring structure 100, and/or a plurality of first semiconductor chips 200 may be variously interconnected and sequentially stacked on the first wiring structure 100.

In some embodiments, the first semiconductor chip 200 may be mounted on the first wiring structure 100 using a flip chip bonding method. For example, first bumps 210 may be formed between the first surface 100_1 of the first wiring structure 100 and a lower surface of the first semiconductor chip 200. The first bumps 210 may electrically connect the first wiring structure 100 and the first semiconductor chip 200.

The first bumps 210 may each include, for example, a first pillar layer 211 and a first solder layer 212.

The first pillar layer 211 may protrude from the lower surface of the first semiconductor chip 200. The first pillar layer 211 may include at least one of, for example, copper (Cu), copper alloy, nickel (Ni), palladium (Pd), platinum (Pt), gold (Au), and cobalt (Co), but the inventive concept is not limited thereto.

The first solder layer 212 may connect the first pillar layer 211 and the first wiring structure 100. In some embodiments, the first solder layer 212 may be electrically connected to some of the first upper pads 122. The first solder layer 212 may have, for example, a spherical shape or an elliptical spherical shape, but the inventive concept is not limited thereto. The first solder layer 212 may include at least one of, for example, tin (Sn), indium (In), bismuth (Bi), antimony (Sb), copper (Cu), silver (Ag), zinc (Zn), and lead (Pb), but the inventive concept is not limited thereto.

The first bumps 210 may provide a signal output from the first semiconductor chip 200 to signal balls 720. In addition, the first bumps 210 may provide a signal input to the signal balls 720 to the first semiconductor chip 200. That is, the first bumps 210 may be electrically connected to the signal balls 720. The first bumps 210 may be connected to the signal balls 720 through the first wiring structure 100.

Thus, in one example, the first bumps 210 may provide a first output signal output from the first semiconductor chip 200 to a first signal ball 721. The first bumps 210 may provide a third output signal output from the first semiconductor chip 200 to a second signal ball 722.

In another example, the first bumps 210 may receive a first input signal input to the first signal ball 721 from the first signal ball 710 and provide the first input signal to the first semiconductor chip 200. The first bumps 210 may receive a second input signal input to the second signal ball 722 from the second signal ball 722 and provide the second input signal to the first semiconductor chip 200.

In some embodiments, a first underfill material 220 may be formed on the first wiring structure 100. The first underfill material 220 may fill a region between the first wiring structure 100 and the first semiconductor chip 200. The first underfill material 220 may fix the first semiconductor chip 200 onto the first wiring structure 100, thereby inhibiting or preventing cracking and chipping of the first semiconductor chip 200. The first underfill material 220 may cover the first bumps 210. The first bumps 210 may penetrate the first underfill material 220 to electrically connect the first wiring structure 100 and the first semiconductor chip 200.

The first underfill material 220 may include an insulating polymer material, such as epoxy molding compound (EMC), but is not limited thereto. In some embodiments, the first underfill material 220 may include at least one different material from that of a first mold layer 600, as will be described in some additional hereafter. For example, the first underfill material 220 may include an insulating material having a superior fluidity to that of the first mold layer 600. Accordingly, the first underfill material 220 may efficiently fill a narrow space between the first wiring structure 100 and the first semiconductor chip 200.

The interposer 300 may be interposed between the first wiring structure 100 and a third wiring structure 800, as will be described in some additional detail hereafter. For example, the interposer 300 may be disposed on the first wiring structure 100 and the first semiconductor chip 200. In some embodiments, the interposer 300 may refer to a second wiring structure 300. The interposer 300 may facilitate the connection between the first wiring structure 100 and the third wiring structure 800. Also, the interposer 300 may prevent the warpage between the first wiring structure 100 and the third wiring structure 800.

The interposer 300 may include a first surface 300_1 and an opposing second surface 300_2. For example, the first surface 300_1 of the interposer 300 may face the first surface 100_1 of the first wiring structure 100, and the second surface 300_2 of the interposer 300 may face a lower surface of the third wiring structure 800, as will be described in some additional detail hereafter.

The interposer 300 may be separated (or spaced apart) from the first wiring structure 100. In addition, the interposer 300 may be spaced apart from the first semiconductor chip 200.

The interposer 300 may include a second insulating layer 310 and a second wiring pad 320. The second insulating layer 310 may include a second lower passivation layer 313, a second substrate 311, and a second upper passivation layer 312. The second wiring pad 320 may include second lower pads 323, a second wiring pattern 321, and second upper pads 322.

The second substrate 311 may be, for example, a PCB or a ceramic substrate, but the inventive concept is not limited thereto. In some embodiments, the interposer 300 may include silicon (Si).

The second wiring pad 320 may be disposed inside the second insulating layer 310. The second wiring pad 320 may be configured as the second wiring pattern 321 for electrically connecting the second lower pads 323 and the second upper pads 322. For example, the second upper pads 322 may be electrically connected to the second lower pads 323 by contacting the second wiring pattern 321.

Although the second insulating layer 310 is shown as having three layers, this is merely a convenient example, and the inventive concept is not limited thereto. For example, the second insulating layer 310 may consist of more than three layers such that a multi-layered second wiring pad 320 may be formed.

The second upper passivation layer 312 and the second upper pad 322 may be formed on the upper surface of the second substrate 311. The second upper passivation layer 312 may cover the upper surface of the second substrate 311 and expose the second upper pads 322.

The second lower passivation layer 313 and the second lower pads 323 may be formed on the lower surface of the second substrate 311. The second lower passivation layer 313 may cover the lower surface of the second substrate 311 and expose the second lower pads 323.

The surfaces of the second substrate 311 may be covered with a solder resist. That is, the second upper passivation layer 312 and the second lower passivation layer 313 that are formed on the surfaces of the second substrate 311 may each be a solder resist. The second upper passivation layer 312 and the second lower passivation layer 313 may include, for example, a photoimageable dielectric (PDI) material, but the inventive concept is not limited thereto.

The connection member 400 may be interposed between the first wiring structure 100 and the interposer 300. The connection member 400 may contact the upper surface of the first wiring structure 100 and the lower surface of the interposer 300. The connection member 400 may electrically connect the first wiring structure 100 and the interposer 300. For example, the connection member 400 may contact the upper surface of the first wiring structure 100 and the second lower pads 323 of the interposer 300. Accordingly, the connection member 400 may electrically connect the first wiring pad 120 and the second wiring pad 320.

The connection member 400 may have, for example, a spherical shape or an elliptical spherical shape, but is not limited thereto. The connection member 400 may include, for example, tin (Sn), indium (In), bismuth (Bi), antimony (Sb), copper (Cu), silver (Ag), zinc (Zn), lead (Pb) and combinations thereof, but is not limited thereto.

The first mold layer 600 may be disposed on the first wiring structure 100. The first mold layer 600 may fill a space between the first wiring structure 100 and the interposer 300. Accordingly, the first mold layer 600 may cover the first wiring structure 100, the first semiconductor chip 200, and the connection member 400. The connection member 400 may penetrate the first mold layer 600 to electrically connect the first wiring structure 100 and the interposer 300.

The first mold layer 600 may include, for example, an insulating polymer material, such as EMC. The first mold layer 600 may include a thermosetting resin such as an epoxy resin, a thermoplastic resin such as polyimide, or a resin including a reinforcing material such as a filler therein, for example, ABF, FR-4, BT resin, and the like.

The filler may be at least one selected from a group consisting of silica ($SiO_2$), alumina ($Al_2O_3$), silicon carbide (SiC), barium sulfate ($BaSO_4$), talc, mud, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$) and calcium zirconate ($CaZrO_3$). However, the material of the filler is not limited thereto, and may include a metal material and/or an organic material.

The third wiring structure 800 may be disposed on the upper surface of the interposer 300. The third wiring structure 800 may be a wiring structure for packaging. For example, the third wiring structure 800 may be a PCB structure, a ceramic wiring structure, etc. Alternatively, the third wiring structure 800 may be a wiring structure for a wafer-level package. The third wiring structure 800 may include a lower surface and an upper surface that are opposite to each other.

The third wiring structure 800 may include a third insulating layer 810 and a third wiring pad 820. The third insulating layer 810 may include a third substrate 811, a third upper passivation layer 812, and a third lower passivation layer 813. The third wiring pad 820 may include a third wiring pattern 821, third upper pads 822, and third lower pads 823.

The third substrate 811 may be, for example, a PCB or a ceramic substrate. However, the inventive concept is not limited thereto.

In the case where the third substrate 811 is a PCB, the third substrate 811 may include at least one material selected from phenol resin, epoxy resin, and polyimide. For example, the third substrate 811 may include at least one material selected from FR-4, tetrafunctional epoxy, polyphenylene ether, epoxy/polyphenylene oxide, bismaleimide triazine (BT), thermount, cyanate ester, polyimide, and liquid crystal polymer.

Surfaces of the third substrate 811 may be covered with a solder resist. That is, the third upper passivation layer 812 and the third lower passivation layer 813 that are formed on the surfaces of the third substrate 811 may each be a solder resist. However, the inventive concept is not limited thereto.

The third lower passivation layer 813 and the third upper passivation layer 812 may include, for example, a PID material, but are not limited thereto.

The third wiring pad 820 may be disposed inside the third insulating layer 810. The third wiring pad 820 may be configured as the third wiring pattern 821 for electrically connecting the third lower pads 823 and the third upper pads 822. The third wiring pattern 821 may include a plurality of wirings and at least one via connecting the wirings.

Although the third insulating layer 810 is illustrated as having three layers, this is merely a convenient example, and the inventive concept is not limited thereto. For example, the third insulating layer 810 may consist of more than three layers such that a multi-layered third wiring pad 820 may be formed.

The third upper passivation layer 812 and the third upper pad 822 may be formed on the upper surface of the third substrate 811. The third upper passivation layer 812 may cover the upper surface of the third substrate 811 and expose the third upper pads 822.

The third lower passivation layer 813 and the third lower pads 823 may be formed on the lower surface of the third substrate 811. The third lower passivation layer 813 may cover the lower surface of the third substrate 811 and expose the third lower pads 823.

Second connection terminals 830 may be interposed between the interposer 300 and the third wiring structure 800. The second connection terminals 830 may be interposed between the second surface 300_2 of the interposer 300 and the lower surface of the third wiring structure 800. The second connection terminals 830 may electrically connect the interposer 300 and the third wiring structure 800. For example, the second connection terminals 830 may contact the second upper pads 322 of the interposer 300 and the third lower pads 823 of the third wiring structure 800.

The second connection terminals 830 may have, for example, a spherical shape or an elliptical spherical shape, but the inventive concept is not limited thereto. The second connection terminals 830 may include at least one of, for example, tin (Sn), indium (In), lead (Pb), zinc (Zn), nickel (Ni), gold (Au), silver (Ag), copper (Cu), antimony (Sb) and bismuth (Bi), but the inventive concept is not limited thereto.

The second semiconductor chip 500 may be disposed on the third wiring structure 800. For example, the second semiconductor chip 500 may be mounted on the upper surface of the third wiring structure 800. The second semiconductor chip 500 may include an integrated circuit (IC) chip having hundreds to millions of semiconductor elements integrated therein.

In some embodiments, the second semiconductor chip 500 may be a logic chip, such as an AP, or a memory chip, such as a volatile memory (e.g., a DRAM) or a nonvolatile memory (e.g., a ROM or flash memory). Hereinafter, the second semiconductor chip 500 will be described as a logic chip including an AP.

Although the illustrated example of FIG. 5 includes a single second semiconductor chip 500 formed on the third wiring structure 800, this is merely a convenient example, and the inventive concept is not limited thereto. For example, a plurality of second semiconductor chips 500 may be disposed in parallel on the third wiring structure 800, or a plurality of second semiconductor chips 500 may be sequentially stacked on the third wiring structure 800.

In some embodiments, the second semiconductor chip 500 may be mounted on the third wiring structure 800 using a flip chip bonding method. For example, second bumps 510 may be formed between the upper surface of the third wiring structure 800 and a lower surface of the second semiconductor chip 500. The second bumps 510 may electrically connect the third wiring structure 800 and the second semiconductor chip 500.

The second bumps 510 may each include, for example, a second pillar layer 511 and a second solder layer 512. The second pillar layer 511 and the second solder layer 512 may be respectively similar to the first pillar layer 211 and the first solder layer 212 described above.

The second bumps 510 may provide a signal output from the second semiconductor chip 500 to the signal balls 720. Also, the second bumps 510 may provide signals input to the signal balls 720 to the second semiconductor chip 500. That is, the second bumps 510 may be electrically connected to the signal balls 720.

The second bumps 510 may be connected to the signal balls 720 through the second wiring structure 300 and the third wiring structure 800. The second bumps 510 may be electrically connected to the signal balls 720 through the connection member 400. For example, the second bumps 510 may provide a signal output from the second semiconductor chip 500 to the signal balls 720 through the third wiring structure 800, the second wiring structure 300, the connection member 400, and the first wiring structure 100.

In some embodiment, the second bumps 510 may be connected to the signal balls 720 through a through-via in the first semiconductor chip 200. For example, the second bumps 510 may provide a signal output from the second semiconductor chip 500 to the signal balls 720 through the third wiring structure 800, the second wiring structure 300, the through-via in the first semiconductor chip 200, and the first wiring structure.

In one example, the second bumps 510 may provide a second output signal output from the second semiconductor chip 200 to the first signal ball 721. The second bumps 510 may provide a fourth output signal output from the second semiconductor chip 500 to the second signal ball 722.

In another example, the second bumps 510 may receive a third input signal input to the first signal ball 721 from the first signal ball 710 and provide the third input signal to the second semiconductor chip 500. The second bumps 510 may receive a fourth input signal input to the second signal ball 722 from the second signal ball 722 and provide the fourth input signal to the second semiconductor chip 500.

In some embodiments, a second mold layer 840 may be formed on the third wiring structure 800. The second mold layer 840 may cover and protect the third wiring structure 800, the second semiconductor chip 500, and the second bumps 510. The second mold layer 840 may include an insulating polymer material, such as EMC, but the inventive concept is not limited thereto.

The first bump 210 and the second bump 510 may be connected to the same signal ball 720. One example of this approach will be described in some additional detail with reference to FIG. 6.

Figure 6:
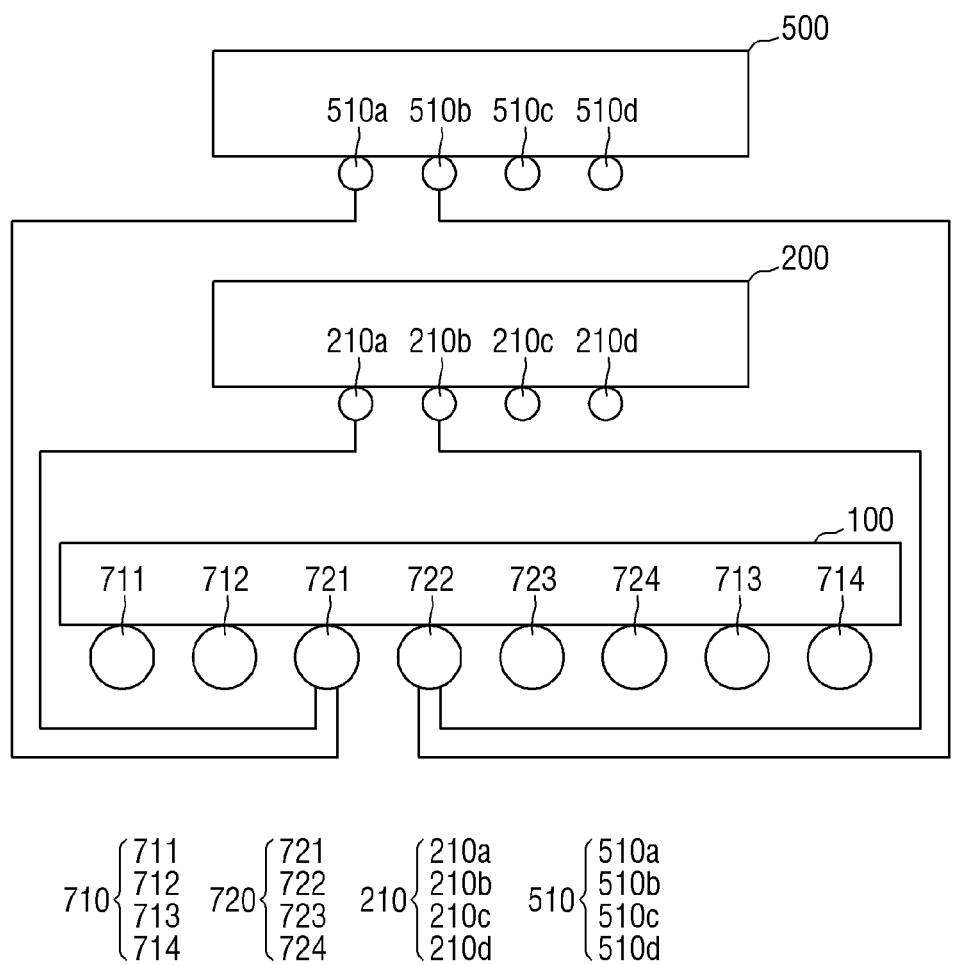
FIGS. 6 and 7 are respective, conceptual diagram illustrating possible electrical connection between the first bumps, the second bumps and the signal balls.
Figure 7:
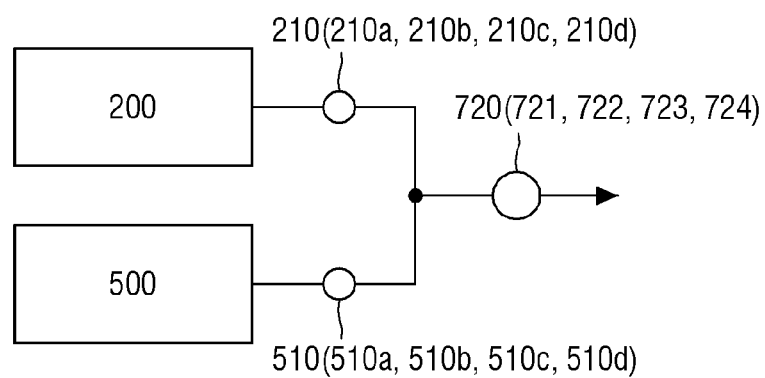

FIG. 6 is a conceptual diagrams illustrating possible electrical connection between the first bumps, the second bumps, the signal balls; FIG. 7 is a conceptual diagram illustrating possible electrical connection between the first semiconductor chip and the second semiconductor chip to the same signal ball through the first bump and the second bump; and FIG. 8 is a table listing exemplary operating modes for the first semiconductor chip and the second semiconductor chip.

Referring to FIG. 6, the first bump 210 and the second bump 510 may each include a plurality of bumps. For example, the first bump 210 may include first-a bump, first-b bump, first c-bump, and a first-d bump (hereafter, "first-a bump to first-d bump 210a to 210d"). Similarly, the second bump 510 may include second-a bump to second-d bump 510a to 510d.

The first connection terminal 700 may include a power ball 710 and a signal ball 720. The power ball 710 and the signal ball 720 may each include a plurality of balls. For example, the power ball 710 may include first to fourth power balls 711 to 714. The signal ball 720 may include first to fourth signal balls 721 to 724.

The power ball 710 may provide power to the first semiconductor chip 200 or the second semiconductor chip 500. When the power ball 710 does not provide power to the first semiconductor chip 200 and/or the second semiconductor chip 500, the first semiconductor chip 200 and/or the second semiconductor chip 500 may be placed in a power-off mode.

The signal ball 720 may externally provide a signal received from the first semiconductor chip 200 and/or the second semiconductor chip 500. The signal ball 720 may provide a signal received from an external source to the first semiconductor chip 200 and/or the second semiconductor chip 500. That is, the signal ball 720 may provide a signal received from the first semiconductor chip 200 through the first bump 210 to an external host 10. The signal ball 720 may provide a signal received from the second semiconductor chip 500 through the second bump 510 to the external host 10. The signal ball 720 may provide a signal received from the external host 10 to the first semiconductor chip 200 through the first bump 210. The signal ball 720 may provide a signal received from the external host 10 to the second semiconductor chip 500 through the second bump 510.

Referring to FIG. 7, the first-a bump 210a and the second-a bump 510a may be connected to the first signal ball 721. The first-a bump 210a may receive a signal from an external source or externally provide a signal through the first signal ball 721. The second-a bump 510a may also receive a signal from an external source, or externally provide a signal, through the first signal ball 721.

Similarly, the first-b bump 210b and the second-b bump 510b may be electrically connected to the second signal ball 722. The first-b bump 210b may receive a signal from the external source or externally provide a signal through the second signal ball 722. The second-b bump 510b may also receive a signal from the external source, or externally provide a signal, through the second signal ball 722.

The first-c bump 210c and the second-c bump 510c may be electrically connected to the third signal ball 723, and the first-d bump 210d and the second-d bump 510d may be electrically connected to the fourth signal ball 724.

That is, one first bump 210 and one second bump 510 may be connected to one signal ball 720. Since all of the first-a bump 210a and the second-a bump 510a are electrically connected to the first signal ball 721, there will be notably less interference between signals input and/or output through the first-a bump 210a and the second-a bump 510a. Accordingly, the first signal ball 721 may output only one of the signals provided through the first-a bump 210a and the second-a bump 510a.

For example, during (or in a first mode, only a signal provided from the first semiconductor chip 200 through the first-a bump 210a may be provided to the first signal ball 721. In the first mode, the first signal ball 721 may not be provided with a signal from the second semiconductor chip 500 through the second-a bump 510a. That is, the first mode may refer to a mode in which a signal is output to the first signal ball 721 from the first semiconductor chip 200 connected to the first signal ball 721 through the first-a bump 210a and a signal is not output from the second semiconductor chip 500 connected to the first signal ball 721 through the second-a bump 510a.

Referring to FIG. 8, during the first mode, the first semiconductor chip 200 may be placed in an output mode, and the second semiconductor chip 500 may be placed in a non-output mode (e.g., an input mode, a fail-safe mode, or a power-off mode).

Here, the term "output mode" denotes a mode wherein a signal or data may be output through an input/output (I/O) pad of a semiconductor chip (e.g., one of the first semiconductor chip 200 and the second semiconductor chip 500). That is, during the output mode, the first semiconductor chip 200 may output a signal or data through an I/O pad of the first semiconductor chip 200, the first bump 210, and the signal ball 720.

The term "input mode" denotes mode wherein a signal or data may be provided to the semiconductor chip (e.g., one of the first semiconductor chip 200 and the second semiconductor chip 500) through an I/O pad of the semiconductor chip.

The term "fail-safe mode" denotes a mode wherein an interface error is prevented during the power-off mode of the semiconductor chip (e.g., one of the first semiconductor chip 200 and the second semiconductor chip 500) or during the process of entering the power-off mode. During the fail-safe mode, the I/O pad of the second semiconductor chip 500 may be placed in a high-impedance state. Therefore, in the fail-safe mode, the second semiconductor chip 500 may not output a signal to the second bump 510 through the I/O pad. Accordingly, the second semiconductor chip 500 may be prevented from affecting communication between the first semiconductor chip 200 and the host 10 during the power-off mode and the process of entering the power-off mode. Similarly, the second semiconductor chip 500 may be protected from possible interference by communications between the first semiconductor chip 200 and the host 10 during the power-off mode and the process of entering the power-off mode.

Accordingly, when the second semiconductor chip 500 is in the fail-safe mode, the second semiconductor chip 500 will not affect the first semiconductor chip 200 communicating (e.g., transmitting and receiving) a signal or data with the host 10 through the signal ball 720. When the first semiconductor chip 200 communicates a signal or data with the host 10 through the signal ball 720, the second semiconductor chip 500 in the fail-safe mode may not provide a signal or data to the first semiconductor chip 200 or the signal ball 720.

Alternately, the second semiconductor chip 500 in the fail-safe mode may not be affected by the first semiconductor chip 200 communicating a signal or data with the host 10 through the signal ball 720. That is, the signal or data that the first semiconductor chip 200 communicates through the signal ball 720 may not be provided to the second semiconductor chip 500.

The term "power-off mode" denotes a mode wherein power supplied to the semiconductor chip (e.g., one of the first semiconductor chip 200 and the second semiconductor chip 500) is turned off. In the power-off mode, the second semiconductor chip 500 will not be provided with the electrical power required communicate a signal or data with the host 10 (e.g., a minimal core power required to operate an internal core circuit).

In the first mode, the second semiconductor chip 500 may have input mode. Since the second semiconductor chip 500 in the input mode does not output a signal, the first signal ball 721 may not be provided with a signal through the second-a bump 510a.

In the first mode, the second-a bump 510a may be in a high-impedance state. That is, the second-a bump 510a may be in an electrically insulated state. Accordingly, the first signal ball 721 may not be provided with a signal through the second-a bump 510a.

For another example, in second mode, the first signal ball 721 may be provided with only the signal provided through the second-a bump 510a from the second semiconductor chip 500. In the second mode, the first signal ball 721 may not be provided with a signal through the first-a bump 210a from the first semiconductor chip 200. That is, the second mode may refer to a mode in which a signal is output to the first signal ball 721 from the second semiconductor chip 500 connected to the first signal ball 721 through the second-a bump 510a and a signal is not output from the first semiconductor chip 200 connected to the first signal ball 721 through the first-a bump 210a.

In the second mode, the second semiconductor chip 500 may have the output mode. In the first mode, the first semiconductor chip 200 may have the non-output mode. The non-output mode may include input mode, fail-safe mode, and power-off mode.

In the second mode, the first semiconductor chip 200 may have the input mode. Since the first semiconductor chip 200 in the input mode does not output a signal, the first signal ball 721 may not be provided with a signal through the first-a bump 210a.

In the second mode, the first-a bump 210a may be in a high-impedance state. That is, the first-a bump 210a may be in an electrically insulated state. Accordingly, the first signal ball 721 may not be provided with a signal through the first-a bump 210a.

For another example, the first signal ball 721 may externally provide the first output signal provided from the first-a bump 310a and may not be provided with a signal from the second-a bump 510a. The first signal ball 721 may not be provided with a signal from the first-a bump 210a and may output the second output signal provided from the second-a bump 510a to the outside.

In the illustrated example of FIG. 6, each of the first bump 210 and the second bump 510 includes four (4) bumps, but this is merely a convenient example, and the inventive concept is not limited thereto. Further, in the illustrated example of FIG. 6, each of the power ball 710 and the signal ball 720 includes four (4) balls, but once again this is merely a convenient example, and the inventive concept is not limited thereto.

In order to prevent signal interference that may occur when the first bump 210 and the second bump 510 share one signal ball 720, the integrated circuit chip 1000 may control the modes of the first semiconductor chip 200 and the second semiconductor chip 500. This approach will be described in some additional detail hereafter with reference to FIGS. 9, 10, 11, 12, 13, 14 and 15.

Figure 9:
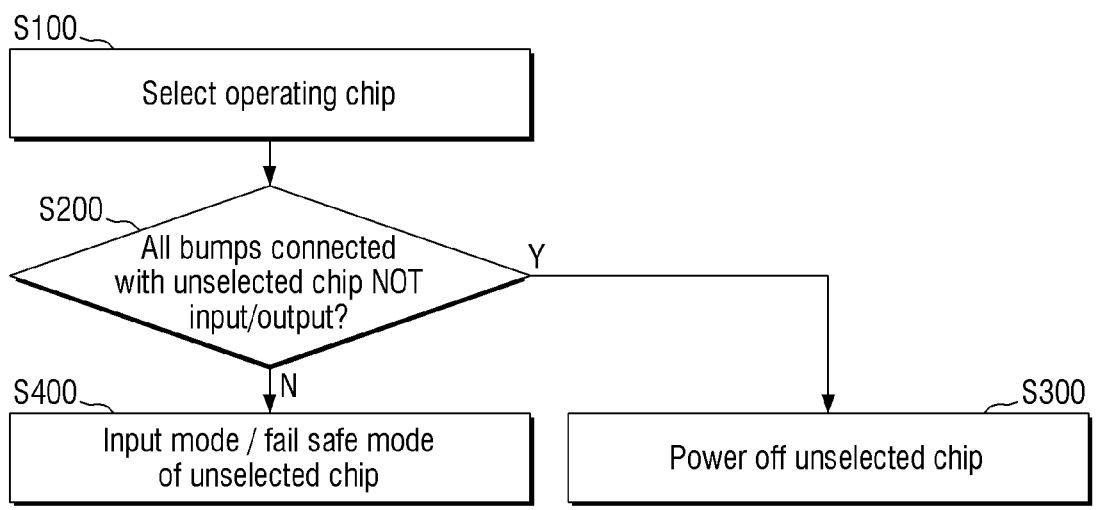
FIG. 9 is a flowchart illustrating an operation of an integrated circuit chip according to embodiments of the inventive concept.
Figure 10:
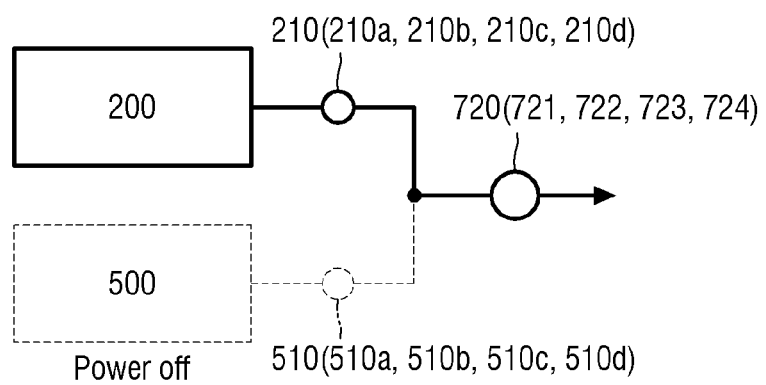
FIGS. 10, 11 and 12 are respective, conceptual diagrams illustrating possible electrical connections during a power-off mode.
Figure 11:
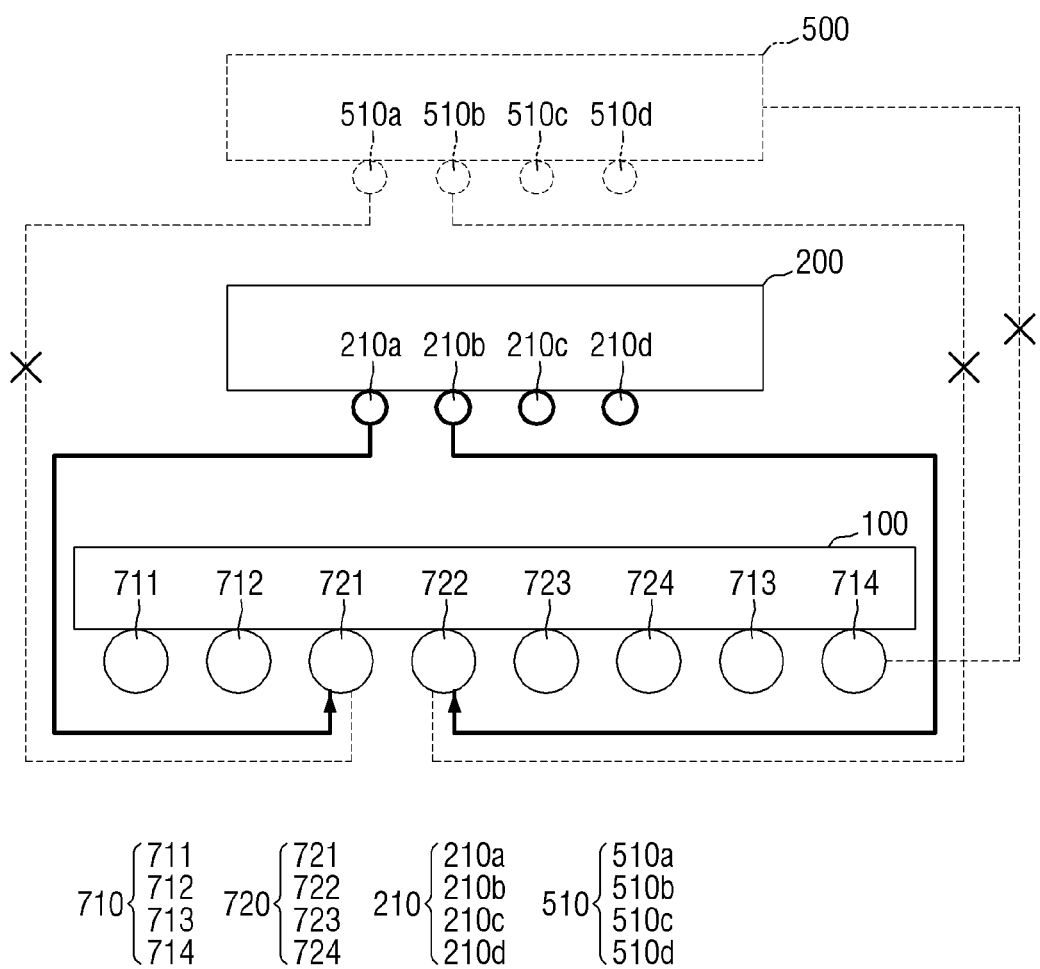
Figure 12:
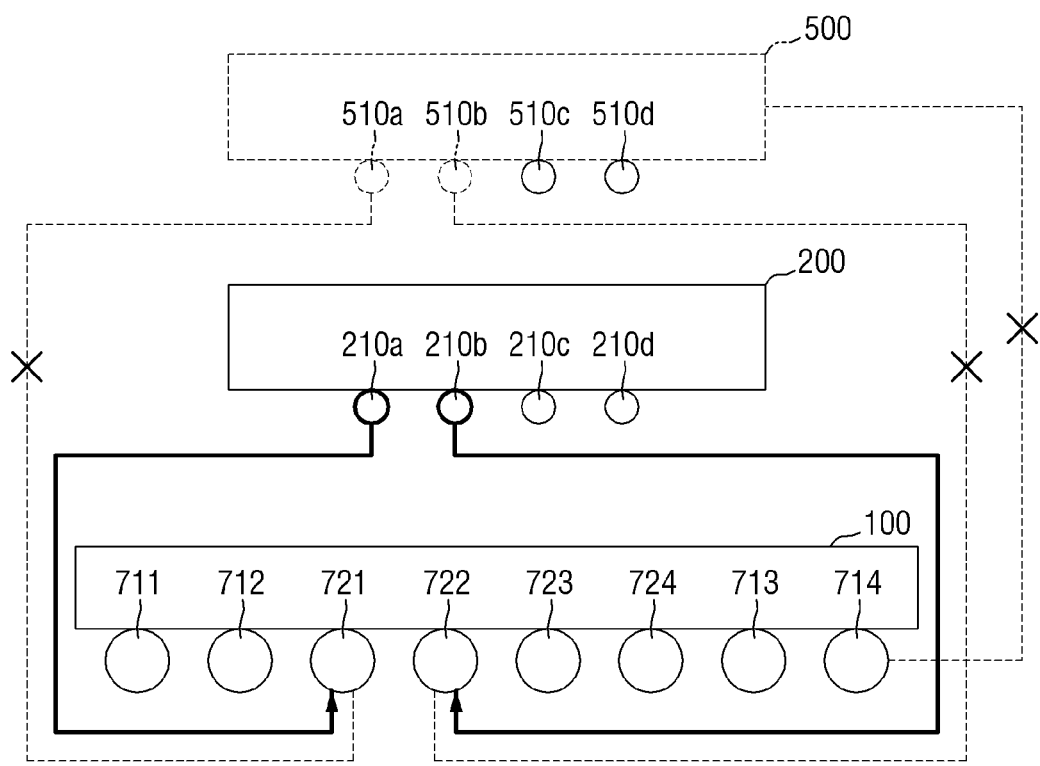
Figure 13:
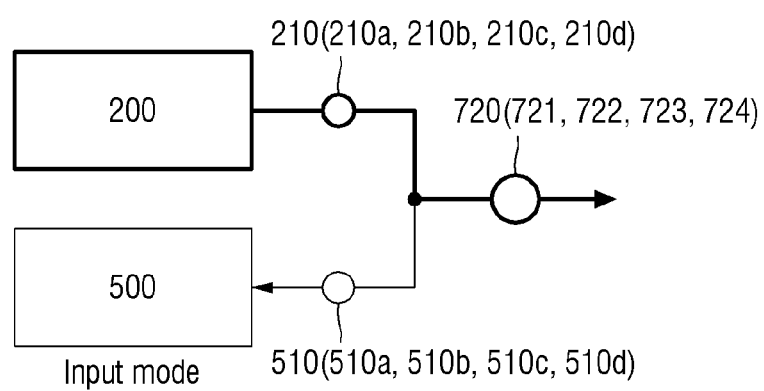
FIG. 13 is a conceptual diagrams illustrating possible electrical connections during an input mode.
Figure 14:
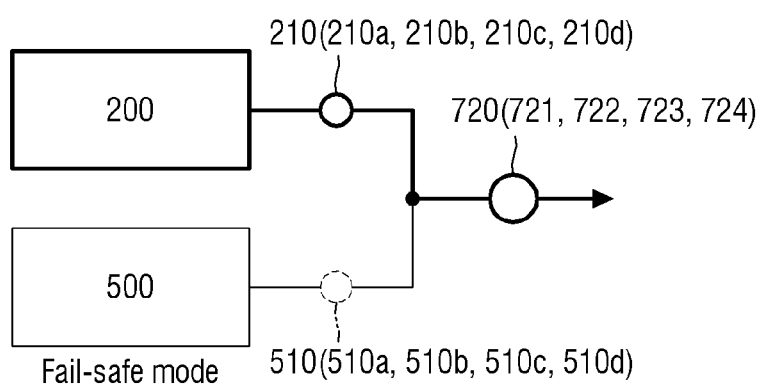
FIGS. 14 and 15 are respective conceptual diagrams illustrating possible connections during a fail-safe mode.
Figure 15:
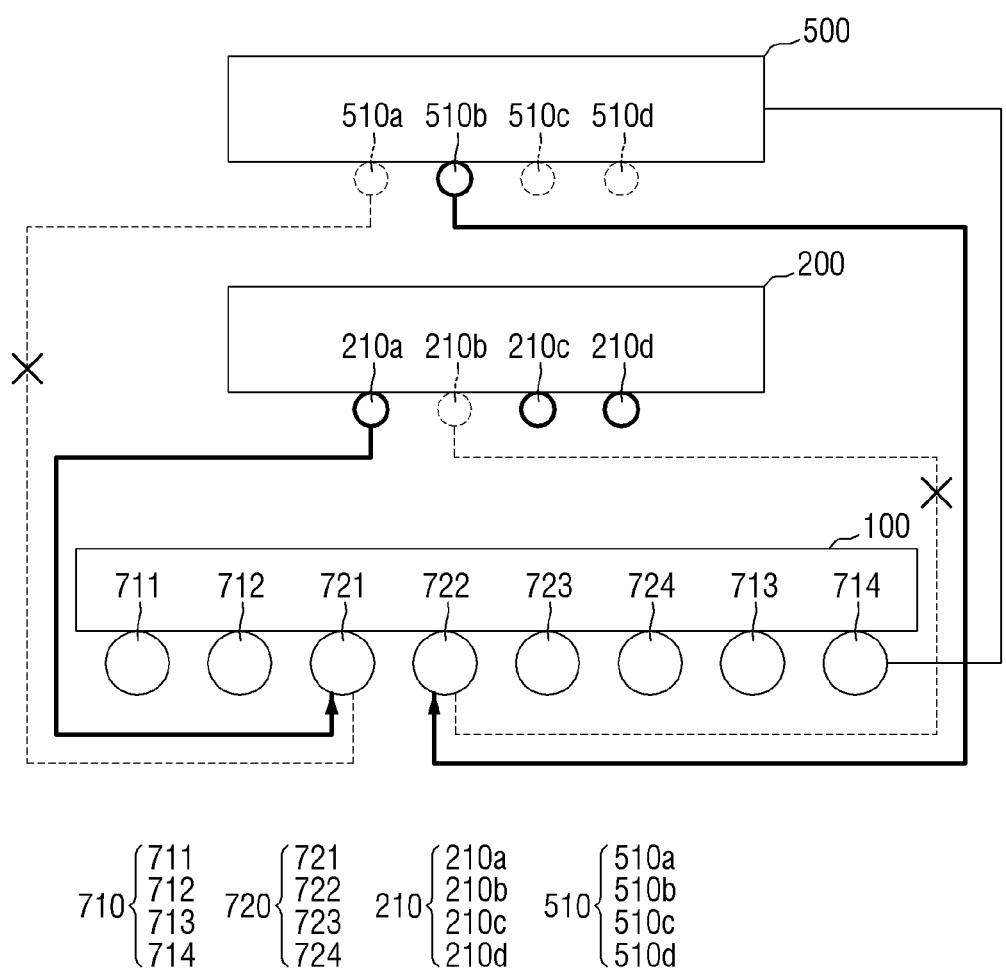

FIG. 9 is a flowchart illustrating operation of an integrated circuit chip according to embodiments of the inventive concept; FIGS. 10, 11 and 12 are respective conceptual diagrams further illustrating possible connections during the power-off mode; FIG. 13 is a conceptual diagram further illustrating possible connections during the input mode; and FIGS. 14 and 15 are respective conceptual diagrams further illustrating possible connections during the fail-safe mode. FIGS. 9, 10, 11, 12, 13, 14 and 15 (hereafter collectively, "FIGS. 9 to 15") illustrate examples of signal(s) output from the first semiconductor chip 200 and/or the second semiconductor chip 500. However, those skilled in the art will appreciate from the following that other embodiments of the inventive concept enable a signal to be received by the first semiconductor chip 200 and/or the second semiconductor chip 500.

Referring to FIGS. 1, 5, and 9, the integrated circuit chip 1000 may select an operating chip (S100).

That is, the integrated circuit chip 1000 may select the operating chip from among the first semiconductor chip 200 and the second semiconductor chip 500. For example, the first semiconductor chip 200 may be selected as the operating chip, and the second semiconductor chip 500 may not be selected as the operating chip. Here, the operating chip may be selected in response to a request received from the host 10.

Thus, the operating chip may refer to the first semiconductor chip 200 or the second semiconductor chip 500 that provides a signal output from one signal ball. That is, the operating chip may refer to a chip that outputs a signal to the host 10.

Accordingly, in order to test the reliability of the electrical connection between the first signal ball 721 and the first-a bump 210a, a determination may be made as to whether the first signal ball 721 outputs a signal provided through the first-a bump 210a from the first semiconductor chip 200. In this case, the first signal ball 721 must be "set" (or designated) to receive a signal from only the first semiconductor chip 200, and not from the second semiconductor chip 500. Accordingly, the first semiconductor chip 200 may be selected as the operating chip.

For another example, a signal related to the first signal ball 721 may be output from the first semiconductor chip 200 upon request from the host 10. When a signal from the first semiconductor chip 200 is output through the first signal ball 721, a setting is required to ensure that a signal is not provided from the second semiconductor chip 500 in order to prevent signal interference. Accordingly, the first semiconductor chip 200 may be selected as the operating chip. The second semiconductor chip 500 is not selected as the operating chip.

When the integrated circuit chip 1000 selects the first semiconductor chip 200 as the operating chip, a signal may be output from the first semiconductor chip 200. When the host 10 requests to output a signal from the first semiconductor chip 200, the second semiconductor chip 500 may provide a command such that the signal is output from the first semiconductor chip 200.

When the integrated circuit chip 1000 selects the second semiconductor chip 500 as the operating chip, a signal may be output from the second semiconductor chip 500. When the host 10 requests to output a signal from the second semiconductor chip 500, the second semiconductor chip 500 may control a signal to be output from the second semiconductor chip 500.

Then, the integrated circuit chip 1000 may determine whether all bumps connected to the unselected chip(s) other than the operating chip are not operating (e.g., input/output) (S200).

That is, the integrated circuit chip 1000 may determine whether or not a signal is provided through all bumps connected to the unselected chip. For example, a determination may be made as to whether any signal is provided through the second bump 510 connected to the second semiconductor chip 500 that has not been selected as the operating chip.

In this regard, when the first semiconductor chip 200 is selected as the operating chip in order to test the reliability of the electrical connection between the first signal ball 721 and the first-a bump 210a, it may be determined whether a signal is input and/or output through the remaining second-b to second-d bumps 510b to 510d other than the second-a bump 510a connected to the second semiconductor chip 500. Such a case may include a case where the first semiconductor chip 200 outputs a signal to the signal ball 720 through the first-b to first-d bumps 210b to 210d. Also, the case may include a case where the second semiconductor chip 500 does not communicate a signal with the signal ball 720 through the second-b to second-d bumps 510b to 510d.

In another example, when the host 10 requests to output the signal related to the first signal ball 721 from the first semiconductor chip 200, it may be determined whether a signal is input and/or output through the remaining second-b to second-d bumps 510b to 510d other than the second-a bump 510a connected to the second semiconductor chip 500 that is not the operating chip. The case where a signal is not input and/or output through the remaining second-b to second-d bumps 510b to 510d other than the second-a bump 510a may include a case where the host 10 inputs a signal to the second semiconductor chip 500 or does not request to output a signal from the second semiconductor chip 500.

Referring to FIGS. 9 and 10, when all bumps connected to the unselected chip are not operating, the integrated circuit chip 1000 may power off the unselected chip (S300). Here, when the bump is said to be "not operating" in this regard, the bump may be understood as not communicating a signal through the bump.

That is, when all signal bumps connected to the unselected chip do not provide any signals, the unselected chip may be safely placed in the power-off mode.

Referring to FIG. 11, all the second bumps 510 connected to the unselected second semiconductor chip 500 may not provide a signal to the signal ball 720.

For example, a case in which the electrical connection between the signal ball 720 and the first-a to first-d bumps 210a to 210d is tested may be included. That is, in a case of testing the electrical connection between the signal ball 720 and the first-a to first-d bumps 210a to 210d, the signal ball 720 must receive a signal only from the first-a to first-d bumps 210a to 210d. Thus, the signal ball 720 is set to not receive a signal from the second-a to second-d bumps 510a to 510d. Accordingly, all the second bumps 510 may not operate.

In another example, signals related to the first signal ball 721 to the fourth signal ball 724 may be output from the first semiconductor chip 200 upon request from the host 10. The first signal ball 721 to the fourth signal ball 724 may be provided with a signal from the first semiconductor chip 200 through the first-a bump 210-1 to the first-d bump 210d, respectively. A signal from the second semiconductor chip 500 is not provided to the first signal ball 721 to the fourth signal ball 724 through the second-a bump 510a to the second-d bump 510d, respectively.

While signals are being provided to the first signal ball 721 to the fourth signal ball 724 from the first semiconductor chip 200 through the first-a to first-d bumps 210a to 210d, respectively, a signal is not output from the second semiconductor chip 500 or a signal is not provided to the second semiconductor chip 500. Thus, the second semiconductor chip 500 may be powered off. Accordingly, the supply of power to the second semiconductor chip 500 from the power ball (714 in FIG. 11) may be turned off.

Referring to FIG. 12, all the second bumps 510 connected to the unselected second semiconductor chip 500 may not be provided with a signal from the signal ball 720 and may not provide a signal to the signal ball 720.

For example, a case in which the electrical connection between the signal ball 720 and the first-a and first-b bumps 210a and 210b is tested may be included. In this case, only the first signal ball 721 connected to the first-a bump 210a and the second signal ball 722 connected to the first-b bump 210b are activated. Since the electrical connection between the first signal ball 721 and the first-a bump 210a is tested, the second-a bump 510a may be set to not provide a signal to the first signal ball 721. Since the electrical connection between the second signal ball 722 and the first-b bump 210b is tested, the second-b bump 510b may be set to not provide a signal to the second signal ball 722.

The third signal ball 723 connected to the first-c bump 210c and the second-c bump 510c and the fourth signal ball 724 connected to the first-d bump 210d and the second-d bump 510d are not activated. That is, the second-c bump 510c connected to the inactivated third signal ball 723 and the second-d bump 510d connected to the fourth signal ball 724 do not all operate. Accordingly, the second-a bump 510a and the second-b bump 510b may be set to not provide a signal to the signal ball 720 and the second-c bump 510c and a signal is not output even when provided to the signal ball 720 from the second-c bump 510c and the second-d bump 510d. Thus, the second bumps 510 may not all operate.

In another example, upon request from the host 10, signals related to the first signal ball 721 and the second signal ball 722 may be output from the first semiconductor chip 200 and signals related to the third signal ball 723 and the fourth signal ball 724 may not be output. Even in this case, since the second bumps 510 do not communicate a signal through the signal ball 720, the second bumps 510 do not all operate.

While a signal is being provided to the first signal ball 721 to the fourth signal ball 724 from the first semiconductor chip 200 through the first-a and first-b bumps 210a to 210b, respectively, a signal is not output from the second semiconductor chip 500 or a signal is not provided to the second semiconductor chip 500. Thus, the second semiconductor chip 500 may be powered off. That is, the second semiconductor chip 500 may be controlled to autonomously power off while a signal is being output from the first semiconductor chip 200. Accordingly, the supply of power to the second semiconductor chip 500 from the power ball (714 in FIG. 11) is turned off.

As described in relation to FIGS. 11 and 12, when all the second bumps 510 that provide a signal from the second semiconductor chip 500 to the signal ball 720 or provide the signal provided from the signal ball 720 to the second semiconductor chip 500 are not operating, the power ball 710 may power off the second semiconductor chip 500. When the power supplied to the second semiconductor chip 500 is turned off, the second semiconductor chip 500 may have the power-off mode.

Referring to FIG. 9, when any one of the bumps connected to the unselected chip is operating, the integrated circuit chip 1000 sets the unselected chip to the input mode or the fail-safe mode (S400).

That is, referring to FIGS. 6 and 13, since the first-a bump 210a provides a signal to the first signal ball 721, the second-a bump 510a may be set to not provide a signal to the first signal ball 721.

For example, a case in which the electrical connection between the first-a bump 210a and the first signal ball 721 is tested by checking whether a signal is normally output to the first signal ball 721 through the first-a bump 210a may be included. Accordingly, the second semiconductor chip 500 may be set to the input mode.

In another example, when a signal related to the first signal ball 721 may be output from the first semiconductor chip 200 upon request from the host 10, the second semiconductor chip 500 may be set to the input mode. Accordingly, the second semiconductor chip 500 may not output a signal to the first signal ball 721 through the second-a bump 510a.

Referring to 6 and 14, a signal may be controlled so as not to be communicated from the second bump 510a to the first signal ball 721 by setting the unselected second semiconductor chip 500 to the fail-safe mode.

That is, referring to FIG. 15, a signal may be provided to the first signal ball 721 from the first-a bump 210a. In addition, a signal may be provided to the third signal ball 723 and the fourth signal ball 724 form the first-c bump 210c and the first-d bump 210d. At this time, the second-a bump 510a may be set to not provide a signal to the first signal ball 721. The second-c bump 510c and the second-d bump 510d are set to not provide a signal to the third signal ball 723 and the fourth signal ball 724, respectively.

Meanwhile, a signal may be provided to the second signal ball 722 from the second-b bump 510b. At this time, the first-b bump 210b is set to not provide a signal to the second signal ball 722. That is, the second semiconductor chip 500 may not provide a signal to the first signal ball 721 through the second-a bump 510a, but may provide a signal to the second signal ball 722 through the second-b bump 510b. In this case, the second semiconductor chip 500 outputs a signal and thus cannot be powered off.

Accordingly, the second semiconductor chip 500 may be set to the fail-safe mode in relation to the first signal ball 721. The second semiconductor chip 500 is continuously supplied with power through the fourth power ball 714. That is, the I/O pad of the second semiconductor chip 500 that outputs a signal to the second-a bump 510a may be set to a high-impedance state while the power of the second semiconductor chip 500 is not turned off. The second semiconductor chip 500 may provide a command such that the I/O pad of the second semiconductor chip 500 that outputs a signal to the second-a bump 510a is set to a high impedance state.

As described in relation to FIG. 15, when a signal is provided through at least one of a plurality of bumps connected to the unselected chip (the first semiconductor chip 200 or the second semiconductor chip 500), the unselected chip may be set to the fail-safe mode.

Although it is illustrated in FIG. 15 that the fourth power ball 714 provides power only to the second semiconductor chip 500, this is merely for simplification of illustration, and the embodiment is not limited thereto. The fourth power ball 714 may also provide power to the first semiconductor chip 200. Alternatively, the first semiconductor chip 200 may be supplied with power through the third power ball 713.

In FIGS. 9 to 15, the first semiconductor chip 200 and the second semiconductor chip 500 have been described as outputting signal(s) through the first and second bumps 210 and 510 and the signal ball 720, but the inventive concept is not limited thereto.

For example, the first semiconductor chip 200 receiving a signal from the first signal ball 721 through the first-a bump 210a may be designated as the selected chip. In this case, the unselected second semiconductor chip 500 may be set to not receive a signal from the first signal ball 721 through the second-a bump 510a.

In another example, when a signal is provided to the first-a bump 210a from the first signal ball 721, the unselected second semiconductor chip 500 may be set to the fail-safe mode or the power-off mode according to whether a signal is provided through the second bump 510.

Certain embodiments of the inventive concept have been presented as teaching examples. Those skilled in the art will appreciate that various modifications may be made to the foregoing embodiments without substantially departing from the scope of the inventive concept, as defined by the following claims.

What is claimed:
1. An integrated circuit chip comprising:
a package substrate including a first signal ball;
a first semiconductor chip on the package substrate;
a second semiconductor chip on the first semiconductor chip;

a first bump disposed between the package substrate and the first semiconductor chip and electrically connected to the first signal ball; and a second bump disposed between the first semiconductor chip and the second semiconductor chip and electrically connected to the first signal ball, wherein, during a first mode of the integrated circuit chip, the first signal ball is configured to receive a signal from the first semiconductor chip through the first bump and not to receive a signal from the second semiconductor chip through the second bump.

2. The integrated circuit chip of claim 1, wherein, during the first mode, the second semiconductor chip is configured to operate in an input mode.

3. The integrated circuit chip of claim 1, wherein, during the first mode, the second bump is in a high-impedance state.

4. The integrated circuit chip of claim 1, wherein, during the first mode, the second semiconductor chip is in a fail-safe mode.

5. The integrated circuit chip of claim 1, wherein during the first mode, the second semiconductor chip is powered off.

6. The integrated circuit chip of claim 5, wherein the package substrate further includes a second signal ball and a power ball, and the integrated circuit chip further comprises:
a third bump disposed between the package substrate and the first semiconductor chip and electrically connected to the second signal ball, wherein the third bump is configured to receive a signal associated with the first semiconductor chip; and
a fourth bump disposed between the first semiconductor chip and the second semiconductor chip and electrically connected to the second signal ball, wherein the fourth bump is configured to receive a signal associated with the second semiconductor chip,
wherein during the first mode, the second semiconductor chip is configured to not output a signal to the fourth bump and not receive a signal from the fourth bump, and the power ball is configured to not provide power to the second semiconductor chip.

7. The integrated circuit chip of claim 1, wherein, during a second mode:
the first signal ball is configured to receive a signal from the second semiconductor chip through the second bump and to not receive a signal from the first semiconductor chip through the first bump; and
the first bump is in a high-impedance state.

8. The integrated circuit chip of claim 1, wherein the second bump is electrically connected to the first signal ball through a through-via (TSV) disposed within the first semiconductor chip.

9. The integrated circuit chip of claim 1, wherein the second bump is electrically connected to the first signal ball through a connection member surrounding the first semiconductor chip.

10. The integrated circuit chip of claim 1, wherein the first semiconductor chip is a memory device, and the second semiconductor chip is an application processor that is configured to control operation of the memory device.

11. A semiconductor package comprising:
a connection terminal including a first signal ball;
a package substrate on the connection terminal;
a first semiconductor chip on the package substrate, electrically connected to the package substrate through a flip-chip structure, configured to output a first output signal through the first signal ball during a first mode, and further configured to not output the first output signal through the first signal ball during a second mode; and a second semiconductor chip on the first semiconductor chip, electrically connected to the first semiconductor chip through a flip-chip structure, configured to output a second output signal through the first signal ball during the second mode, and further configured to not output the second output signal through the first signal ball during the first mode, wherein during the first mode, the first semiconductor chip is in an output mode and the second semiconductor chip is in a non-output mode, wherein during the second mode, the second semiconductor chip is in the output mode and the first semiconductor chip is in the non-output mode, wherein first semiconductor chip is a memory device, and wherein the second semiconductor chip is an application processor that that is configured to control operation of the memory device.

12. The semiconductor package of claim 11, wherein, during the first mode, the first semiconductor chip is further configured to output the first output signal to the first signal ball through a first bump disposed between the first semiconductor chip and the package substrate, and wherein, during the second mode, the second semiconductor chip is further configured to output the second output signal to the first signal ball through a second bump disposed between the second semiconductor chip and the first semiconductor chip.

13. The semiconductor package of claim 11, wherein the non-output mode is an input mode.

14. The semiconductor package of claim 11, wherein the non-output mode is a fail-safe mode.

15. The semiconductor package of claim 14, wherein the connection terminal further comprises a second signal ball, and wherein one of the first semiconductor chip in the non-output mode and the second semiconductor chip in the non-output mode is configured to output a third signal through the second signal ball or to receive the third signal from the second signal ball.

16. The semiconductor package of claim 11, wherein the second semiconductor chip in the non-output mode is powered off during the first mode, or wherein the first semiconductor chip in the non-output mode is powered off during the second mode.

17. The semiconductor package of claim 16, wherein the connection terminal further comprises a power ball configured to supply power to a second signal ball, the first semiconductor chip, and the second semiconductor chip, wherein the first semiconductor chip in the non-output mode is configured to not communicate a signal through the second signal ball during the second mode, and wherein the second semiconductor chip in the non-output mode is configured to not communicate a signal through the second signal ball during the first mode.

18. A semiconductor package comprising:
a connection terminal including a first signal ball and a second signal ball;
a package substrate on the connection terminal and electrically connected to the connection terminal;
a first semiconductor package on the package substrate and including a first semiconductor chip configured to output a first output signal to the first signal ball through a first bump electrically connected to the package substrate and to output a third output signal to the second signal ball through a third bump; and a second semiconductor package on the package substrate and including a second semiconductor chip configured to output a second output signal to the first signal ball through a second bump electrically connected to the package substrate and to output a fourth output signal to the second signal ball through a fourth bump, wherein the first semiconductor package and the second semiconductor package are vertically stacked on the package substrate, wherein the first signal ball is configured to output one of the first output signal provided from the first bump and the second output signal provided from the second bump, wherein, when the first signal ball outputs the first output signal, the first semiconductor chip operates in an output mode and the second semiconductor chip operates in one of an input mode, a fail-safe mode, and a power-off mode, wherein the second bump is electrically connected to the first signal ball through a through-via disposed within the first semiconductor chip, and wherein the fourth bump is electrically connected to the second signal ball through a connection member disposed around the first semiconductor chip.

19. The semiconductor package of claim 18, wherein the second semiconductor chip operates in the fail-safe mode and is configured to output a third signal to the fourth bump or to receive the third signal from the fourth bump.

20. The semiconductor package of claim 18, wherein the second semiconductor chip operates in the power-off mode and is configured to not communicate a signal with the fourth bump.

* * * * *